(12) United States Patent
Klotz

(10) Patent No.: US 8,215,298 B2
(45) Date of Patent: Jul. 10, 2012

(54) SOLAR MODULE SYSTEM OF THE PARABOLIC CONCENTRATOR TYPE

(76) Inventor: Fritz Klotz, Rudersberg (DE)

( * ) Notice: Subject to any disclaimer, the term of this patent is extended or adjusted under 35 U.S.C. 154(b) by 52 days.

(21) Appl. No.: 12/280,328

(22) PCT Filed: Feb. 22, 2007

(86) PCT No.: PCT/EP2007/001525
§ 371 (c)(1),
(2), (4) Date: Aug. 27, 2010

(87) PCT Pub. No.: WO2007/096158
PCT Pub. Date: Aug. 30, 2007

(65) Prior Publication Data
US 2010/0319682 A1    Dec. 23, 2010

(30) Foreign Application Priority Data
Feb. 23, 2006    (DE) ............... 10 2006 009 412

(51) Int. Cl.
*F24J 2/02*    (2006.01)
(52) U.S. Cl. ............ 126/680; 126/690; 126/696
(58) Field of Classification Search ......... 126/680, 126/685, 696, 694, 688–691; 136/244, 246, 136/292; 359/854
See application file for complete search history.

(56) References Cited

U.S. PATENT DOCUMENTS

| | | | |
|---|---|---|---|
| 3,982,527 A * | 9/1976 | Cheng et al. | 126/690 |
| 4,078,549 A * | 3/1978 | McKeen et al. | 126/606 |
| 4,079,724 A * | 3/1978 | Zwillinger | 126/658 |
| 4,081,965 A * | 4/1978 | deGeus | 60/641.15 |
| 4,153,474 A * | 5/1979 | Rex | 136/246 |
| 4,222,368 A * | 9/1980 | Rost et al. | 126/600 |
| 4,674,244 A | 6/1987 | Francovitch | |
| 5,114,101 A * | 5/1992 | Stern et al. | 244/172.8 |
| 5,180,441 A * | 1/1993 | Cornwall et al. | 136/246 |
| 5,344,496 A | 9/1994 | Stern et al. | |
| 6,059,438 A * | 5/2000 | Smith et al. | 362/583 |
| 6,553,729 B1 | 4/2003 | Nath et al. | |
| 2003/0201007 A1 | 10/2003 | Fraas et al. | |

FOREIGN PATENT DOCUMENTS

| | | |
|---|---|---|
| DE | 25 57 296 A1 | 6/1977 |
| DE | 25 57 298 A1 | 6/1977 |
| DE | 91 16 543.1 | 3/1993 |
| DE | 298 13 771 U1 | 1/2000 |
| DE | 100 41 271 A1 | 3/2002 |
| DE | 20 2004 005 198 U1 | 7/2004 |

(Continued)

OTHER PUBLICATIONS

International Search Report dated Jul. 11, 2007 including English translation (Four (4) pages).

(Continued)

*Primary Examiner* — Alfred Basichas
(74) *Attorney, Agent, or Firm* — Crowell & Moring LLP

(57) ABSTRACT

A solar module system includes a self-supporting structure and at least one solar module element or reflector element which can be arranged on the support structure. The support structure includes a plurality of juxtaposed support profiles in the form of self-supporting hollow chamber profiles, which have front parabolic concentrator reflector functional surfaces and solar module functional surfaces on the side facing away from the front. The system is used e.g. for photovoltaic systems outdoors or on buildings.

26 Claims, 4 Drawing Sheets

FOREIGN PATENT DOCUMENTS

| | | |
|---|---|---|
| DE | 103 17 020 A1 | 11/2004 |
| GB | 2 340 993 A | 3/2000 |
| JP | 10-102708 A | 4/1998 |
| WO | WO 01/67523 A1 | 9/2001 |
| WO | WO 2004/114419 A1 | 12/2004 |

OTHER PUBLICATIONS

German Office Action dated Oct. 11, 2006 with English translation (Thirteen (13) pages).

Mohring, H.D. et al, Solar electric concentrators with small concentration ratios: field experience and new developments. In: Conference Record of the Twenty-Ninth IEEE Photovoltaic Specialist Conference 2002. ISBN 0-7803-7471-1, 2002, pp. 1608-1611.

Weatherby, Clive et al., "Further Development and Field Test Results of Two Low-Material-Cost Parabolic-Trough PV Concentrators", PV Modules and Components of PV Systems, $2^{nd}$ World Conference and Exhibition on Photovoltaic Solar Energy Conversion, 6-10, Jul. 1998, pp. 2189-2192 Vienna, Austria.

F. Dobon et al., Controlled Atmosphere PV Concentrator (CAC) $17^{th}$ European Photovoltaic Solar Energy Conference, Oct. 22-26, 2001, pp. 668-671 Munich, Germany.

International Preliminary Report (six (6) pages), 2008.

* cited by examiner

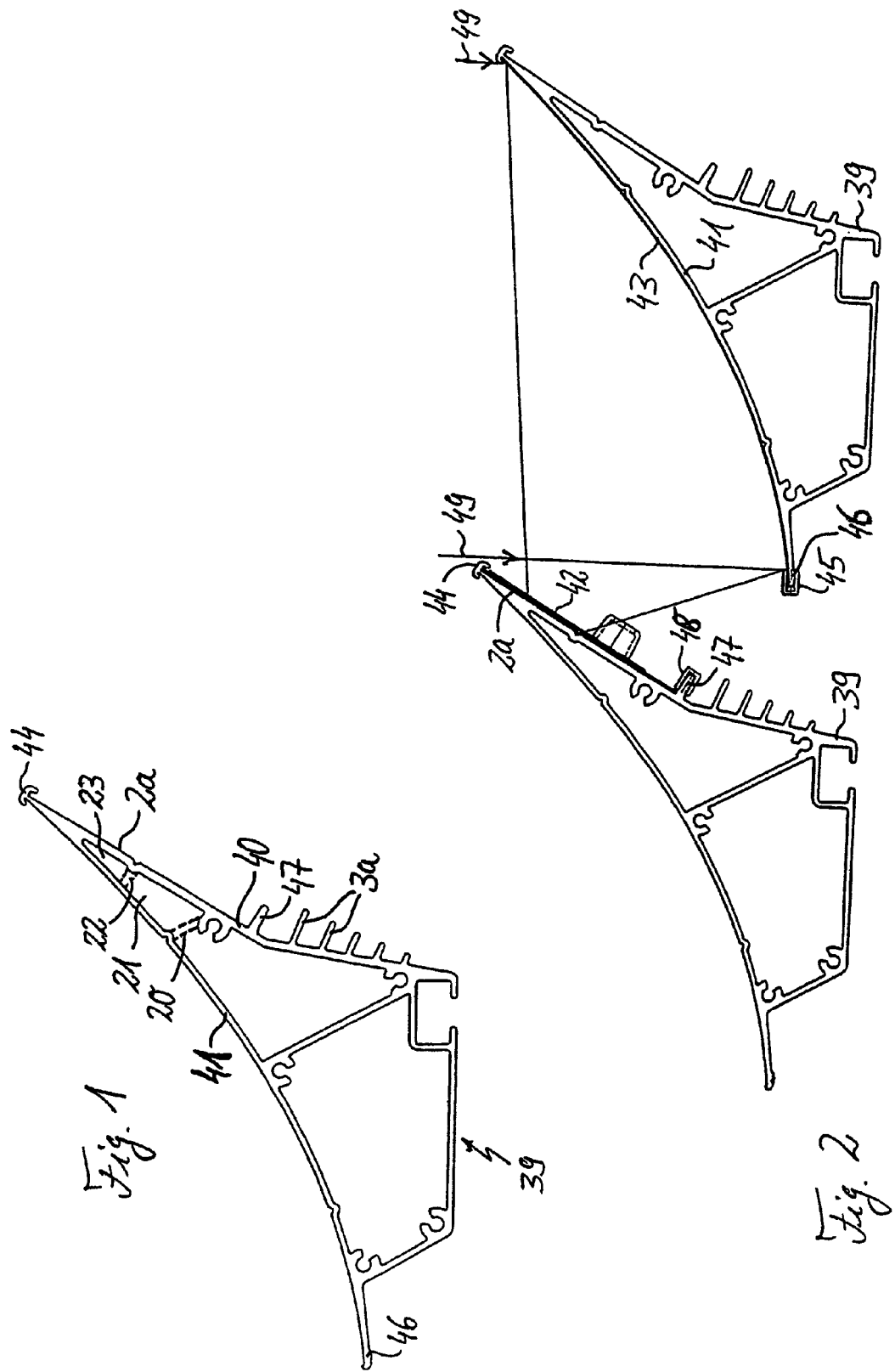

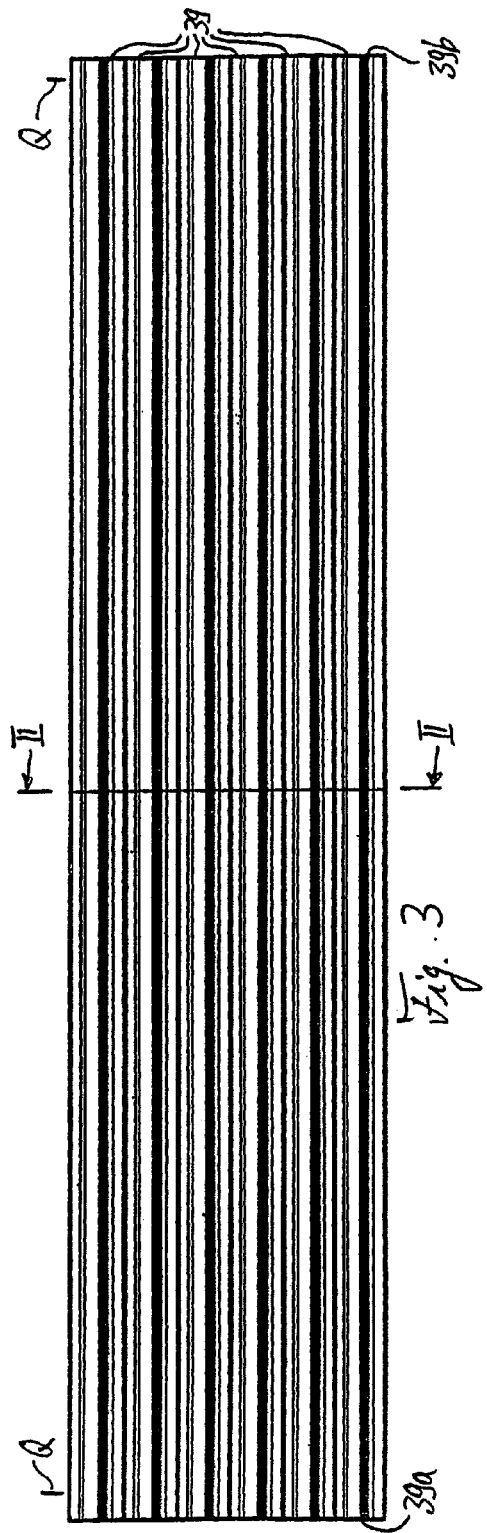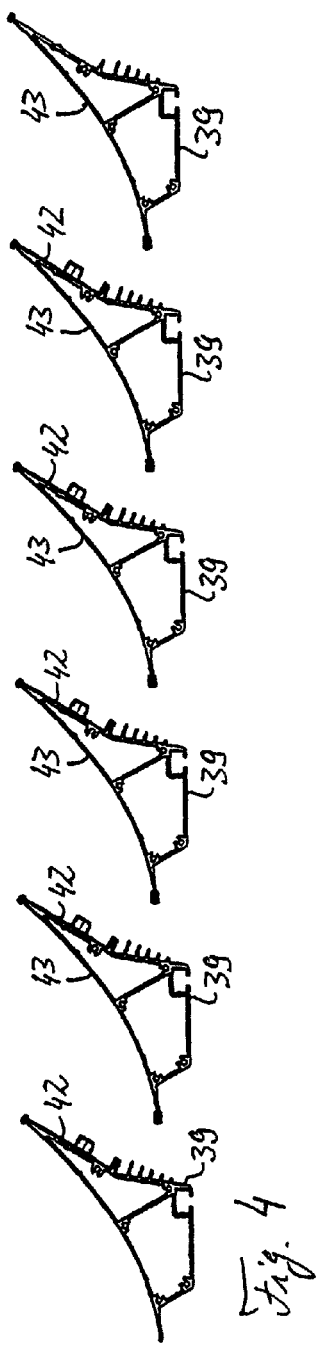

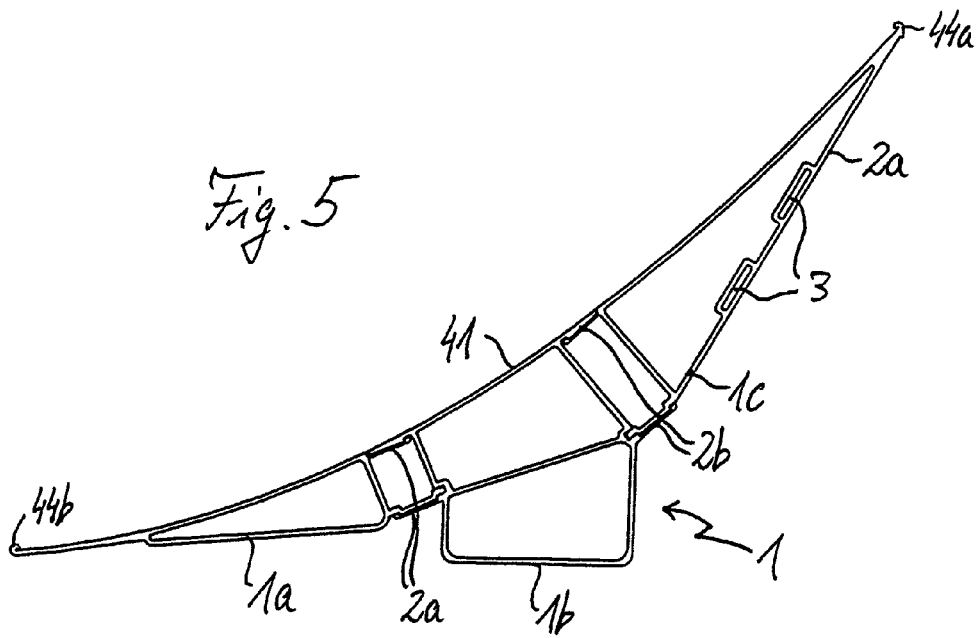
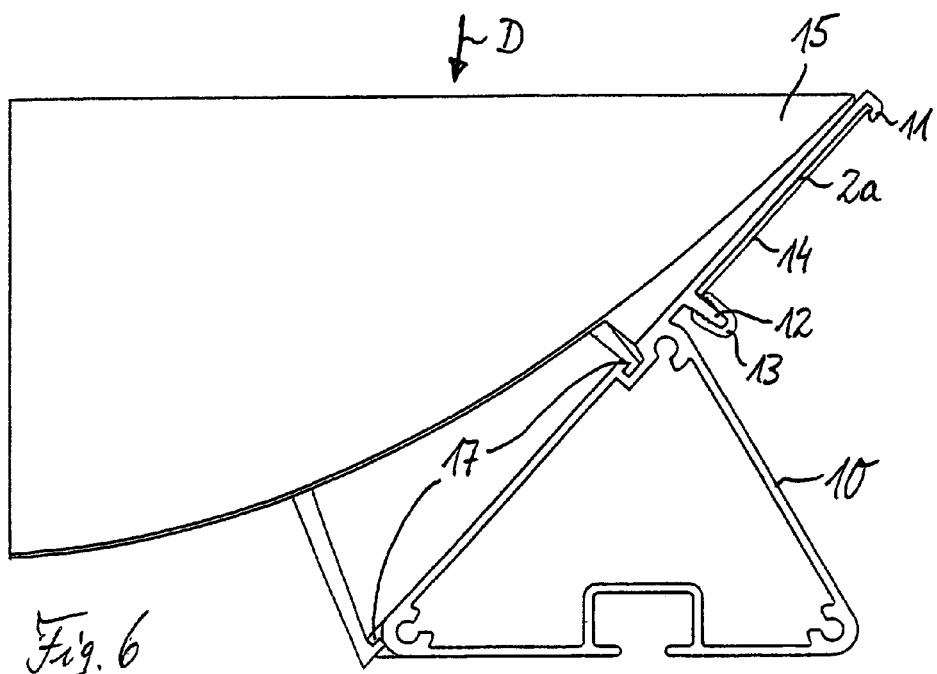

SOLAR MODULE SYSTEM OF THE PARABOLIC CONCENTRATOR TYPE

BACKGROUND AND SUMMARY OF THE INVENTION

The invention relates to a parabolic concentrator type solar module system having a support structure and at least one solar module or reflector element which can be arranged on the support structure. Solar module systems such as these are in use in widely different embodiments as photovoltaic systems and thermal solar collector systems. For simplicity, in the present case, the expression solar module covers both photovoltaic modules and thermal solar collector modules.

Published German specification DE 100 41 271 A1 discloses a roof cover or wall cladding composed of self-supporting sheet-metal panels, to the outside of which a photovoltaic module, which is protected by an outer covering layer composed of a translucent plastic, is applied. A system with controlled heat dissipation and/or heat supply is kept in thermally conductive contact with the sheet-metal panels, from underneath the panels. The photovoltaic module may be applied to the respective sheet-metal panel as a flexible composite film over the entire area. Similar photovoltaic module laminates for mounting flat on a support layer by pressing or adhesive bonding, or in a self-adhesive embodiment, are described respectively in published specification WO 01/67523 A1 and U.S. Pat. No. 6,553,729 B1.

Published British specification GB 2 340 993 A describes a photovoltaic structure in which a module mount is formed comprising a lower, flat steel plate, a steel plate arranged at a distance from it with the interposition of an insulating material and profiled in a corrugating shape forming a duct, and an upper flat steel plate placed thereon. A photovoltaic flat module is applied to the upper steel plate. The hollow ducts, which are formed between the profiled steel plate forming the duct and the upper steel plate, act as cooling ducts.

As is known, apart from non-concentrating flat-module systems, concentrating solar module systems are also in commercial use, for example of the so-called V-trough type, see for example US published specification 2003/0201007 A1 and WO/2004/114419 A1, and of the parabolic concentrated type, see for example the Conference Proceedings Articles by C. K. Weatherby et al., Further Development and Field Test Results of Two Low-Material-Cost Parabolic-Trough PV Concentrators, $2^{nd}$ World Conference and Exhibition on Photovoltaic Solar Energy Conversion, Jul. 6 to 10, 1998, Vienna, Austria, page 2189 and F. Dobon et. al., Controlled Atmosphere PV Concentrator (CAC), $17^{th}$ European Photovoltaic Solar Energy Conference, Oct. 22 to 26, 2001, Munich, Germany, page 668.

Published German specification DE 2557296 A1 discloses a solar module system of the parabolic concentrator type primarily for space flight applications, in which a plurality of parabolic mirror strips, which are arranged alongside one another, are held in a frame structure with side walls and lateral strips. The frame structure itself is mounted on one lateral face via a holding apparatus on a satellite body such that it can move. Solar cell strips are thermally conductively attached to the rear face of each mirror strip. The rear faces of the mirror strips are designed to emit heat, in order to cool the solar cell strips.

A similar solar module system for space flight applications is disclosed in U.S. Pat. No. 5,344,496. In the system there, parabolic mirror strips are likewise arranged alongside one another and/or one behind the other in a frame structure composed of side walls, and are provided with a respective solar cell strip on their rear face. In one embodiment, the mirror strips which are located one behind the other are formed integrally by a reflector element in the form of a corrugated metal sheet, one of whose corrugation flanks forms the parabolic mirror surfaces with a solar cell strip mounted on the rear face, and whose other corrugation flanks are each provided with a recess in the form of a slot, in order that the reflected light passes through the slots to the solar cell strips. In another embodiment, the mirror elements are in the form of individual elements tilted up along the lower side edge and tilted around toward the rear on the upper side edge, and are inserted one behind the other into a trough with bottom walls and side walls such that a slot remains open between the top bend of one element and the bottom upward bend of a next element, in order that reflected light can pass through this slot onto a solar cell strip which is in each case fitted at the rear.

The technical problem on which the invention is based is to provide a solar module system of the type mentioned initially which can be produced with comparatively little manufacturing effort and is also suitable for relatively large-scale installations in large power stations, in the open air, and for building integration on roofs and facades.

The invention solves this problem by providing a solar module system designed specifically as a parabolic concentrator system, in which a plurality of support profiles are arranged alongside one another in the form of self-supporting hollow-chamber profiles, with the hollow-chamber profile having a reflector functional area on the front face and a solar module functional area on a side facing away from the front face. This makes it possible, for example, to produce concentrator systems of the parabolic reflector type in a relatively simple manner by radiation which is incident on the front face being reflected by a respective reflector element on a support profile such that it is concentrated on a solar module, averted from the front face, of an adjacent support profile. In this case, the expression "self-supporting" means, as one skilled in the art in this field would understand, a configuration of the support profile chosen such that the support profile supports itself with the element or elements fitted thereto over a certain span width of typically up to several meters in the present applications of solar module systems, for example, between approximately 2 m and 10 m, without any need to provide a close-meshed sub-structure, to be precise including the support loads to be calculated in during operation, in this case in particular resulting from wind and snow loads. The support profile with this meaning consequently does not require any sub-structure longitudinal supports and, for lengths which are typically used in this application, generally requires only one central or two end supports, which in the latter case can typically be drawn in somewhat, that is to say with a short separation which is much less than the support profile length.

In one advantageous development of the invention, which is advantageous from the manufacturing point of view, the support profiles are in the form of extruded profiles, strand-drawn profiles or roll-formed profiles.

Advantageous materials for the support profiles are specified herein.

In a refinement of the invention, a heat dissipation structure is provided on the support profile and is thermally conductively connected to the solar module and/or reflector functional area. The integrated heat dissipation structure of the support profiles provides a desired cooling function, with little complexity, for solar modules and/or reflector elements that are fitted. For example, it can be produced in a simple manner from a manufacturing point of view by a longitudinal rib structure in the form of an integral part on the support profile.

In a further development of the invention, the support profile has one or more heating or cooling medium ducts and/or ducts for lines to pass through. The heating or cooling medium ducts can be used for a liquid or gaseous heating or cooling medium to be passed through, in order to cool or else to heat the support profile, as required. The ducts for lines to pass through can be used for electrical lines to pass through.

In a still further development of the invention, each hollow-chamber profile is formed from a plurality of profiled parts which are plugged together on the longitudinal side. This makes it possible to simplify both manufacture and installation of the system, especially for applications with relatively large-area reflectors.

In a yet still further development of the invention, each hollow-chamber profile has a line-focus parabolic reflector surface which is continuous in the longitudinal direction, that is to say incident solar radiation is focused or concentrated by this parabolic concentrator reflector functional area onto a line which runs in the support profile longitudinal direction or a corresponding strip of finite width. In an alternative development of the invention, each hollow-chamber profile has a plurality of separate point-focus parabolic reflector surfaces which are arranged alongside one another in the longitudinal direction. Each of these point-focus reflector elements focuses or concentrates incident radiation on a point or a spot where a corresponding solar module element is accordingly located. When required, this alternative embodiment allows an even greater concentration level or greater savings of active solar module area.

Advantageous embodiments of the invention will be described in the following and are illustrated in the drawings.

BRIEF DESCRIPTION OF THE DRAWINGS

FIG. 1 shows a cross section through a support profile for a photovoltaic system of the line-focus parabolic concentrator type;

FIG. 2 shows a cross section through a part of a photovoltaic system, formed using support profiles as shown in FIG. 1, of the parabolic concentrator type;

FIG. 3 is a plan view of a photovoltaic system of the line-focus parabolic concentrator type with six support profiles as shown in FIG. 1 located alongside one another;

FIG. 4 shows a cross-sectional view taken along line II-II in FIG. 3;

FIG. 5 shows a cross section corresponding to FIG. 1 for a variant with a support profile which is plugged together from a plurality of parts and is provided with heating or cooling ducts;

FIG. 6 shows a cross section corresponding to a support profile of FIG. 1 for a variant of the point-focus parabolic concentrator type;

DETAILED DESCRIPTION OF THE DRAWINGS

Figure 7:
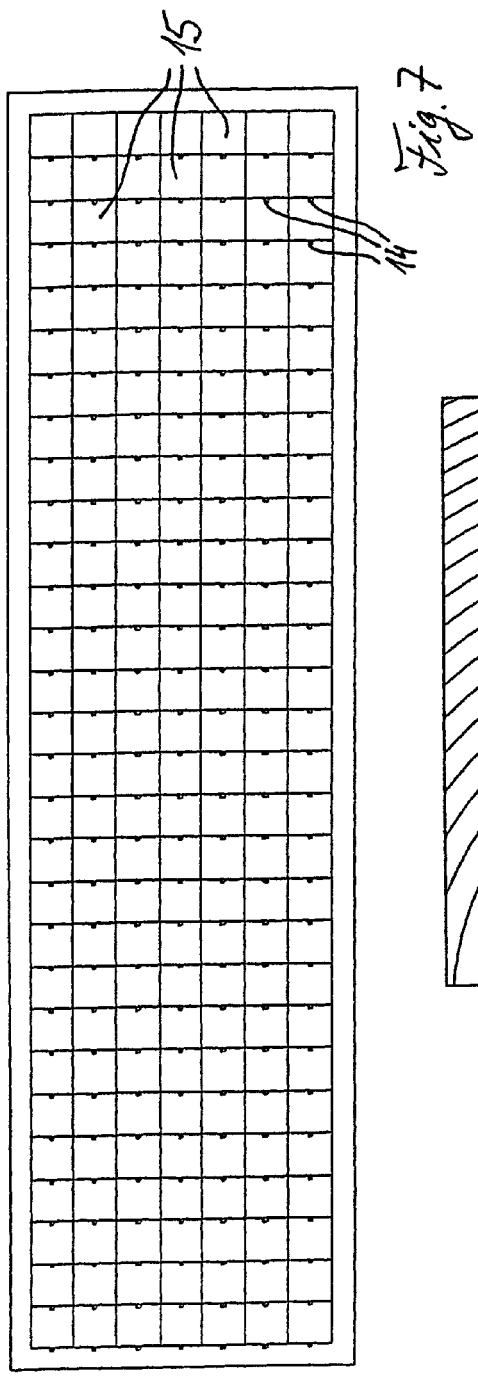
FIG. 7 is a plan view of a photovoltaic system of the point-focus parabolic concentrator type with an array of individual point-focus reflector elements as shown in FIG. 6.

Various exemplary embodiments of the invention will be explained in more detail in the following with reference to the drawings, with identical or functionally equivalent components being provided with the same reference symbol in each of the drawings, for the sake of clarity.

FIGS. 1 to 4 illustrate a photovoltaic system of the line-focus parabolic concentrator type using a support structure, which is formed from suitably designed identical support profiles arranged in one or more rows. Specifically, a hollow-chamber longitudinal profile 39 which is illustrated in the form of a cross section in FIG. 1 and is linear in the longitudinal direction in this case, acts as a support profile, on which a module holding area 2a is formed on a rearward profile side wall 40 in a front part, and a thermally conductive rib structure 3a is formed in a rear part. A profile side surface 41 at the front is curved parabolically and acts as a reflector holding surface.

FIG. 2 shows two support profiles 39, arranged alongside one another, in the in-use position. In order to illustrate the light-concentrating function, the support profile 39 on the left in FIG. 2 is shown with a solar module 42 fitted to its module holding surface 2a, and the support profile 39 on the right in FIG. 2 is shown with a reflector element 43 applied over its entire area on its parabolic reflector holding surface 41. In the example in FIG. 2, the solar module 42, which extends in the form of a strip in the support profile longitudinal direction, and the reflector element 43 are each held by clamping. For this purpose, a double holding tab structure 44 is integrally formed on the front longitudinal edge of the support profile 39, holds the reflector element 43 on its front face, facing the incident light, and holds the solar module 42 on its rearward face, in each case in a holding groove.

The reflector element 43 is held on the other longitudinal edge by a clamping profile 45 with a U-shaped cross section, which can be latched onto a corresponding projection 46 on the holding profile 39, for which purpose the rear face of this projection 46 and the corresponding inner face of the clamping profile 45 are provided with suitable latching grooves. In a similar manner, the solar module 42 is kept pressed against the module contact surface 2a on its longitudinal face opposite the holding tab 44, by a further U-shaped clamping profile 48, and is plugged onto a corresponding, grooved latching tab 47 on the support profile 39. This latching tab 47 projects as a longitudinal web corresponding to the heat dissipation ribs 3a outward from the associated profile wall 40.

As illustrated in FIG. 2, incident light radiation 49 is reflected by the parabolic reflector 43 in the form of a line or strip such that it is concentrated on the active area component of the solar module element 42. FIGS. 3 and 4 respectively show a plan view and a cross-sectional view of a photovoltaic system, which is formed from six support profiles 39, according to this parabolic concentrator variant, with the illustrated example resulting in a concentration factor of about ten.

As a result of the self-supporting characteristic of the support profiles 39 just one approximately centrally arranged lateral support, for example arranged at the level of the line II-II in FIG. 3, is sufficient to hold the entire structure in a manner which is not illustrated in any more detail, or, alternatively, two end lateral supports can be provided for this purpose in the area of the two end faces 39a, 39b of the support profiles 39 or separated by a short distance of, for example, up to a few tens of centimeters at a lateral support height Q, with the support profiles 39 typically having lengths between about 2 m and about 10 m, and in exceptional cases also a lesser or greater length.

If required, cooling or heating can be provided for the support profile 39, in particular in the area of its module holding surface 2a. For this purpose, one or more hollow chambers or hollow ducts is or are provided in each case in embodiments relating to this, through which a liquid or gaseous heating or cooling medium can be passed. FIG. 1 shows two implementation options with hollow ducts such as these of different size, as an option. Thus, for example, a profile intermediate wall 20 is illustrated by dashed lines, with which wall a support profile 39 can optionally be provided in order to form a heating or cooling duct 21 adjacent to the module holding surface 2a. As a further option, a profile intermediate wall 22 is shown by dashed lines, which, when provided, forms a smaller heating or cooling duct 23 in the upper part of the support profile 39. A liquid or gaseous cooling or heating medium can be passed through the relevant heating or cooling duct 21 or 23 in order to cool or to heat the support profile 39 in this area, and in particular in the area of the module holding surface 2a. It is self-evident that any desired further and/or other hollow chambers may be provided by means of corresponding profile intermediate wall structures, and can act as cooling or heating ducts, or else as ducts for electrical lines or the like to be passed through.

FIG. 5 shows a variant of the line-focus parabolic concentrator type shown in FIGS. 1 to 4. This variant contains a modified hollow-chamber longitudinal profile 1 as a support module, which is formed from three parts 1a, 1b, 1c plugged together on the longitudinal side. In this case, the central part 1b forms a base body onto whose two longitudinal sides in each case one of the two other parts 1a, 1c is plugged via a longitudinally running latching/plug-in connection 2a, 2b in each case, resulting at the front in the reflector holding surface 41 which also runs smoothly and flush over the plug connections 2a, 2b. Once again, inter alia, suitable holding tabs 44a, 44b are used to hold a reflector element placed thereon. All three support profile parts 1a, 1b, 1c are themselves in the form of a hollow-chamber profile. Assembly from three parts simplifies manufacture and installation of the support profile 1, particularly for relatively large-area embodiments. The plug-in latching tabs and plug-in latching tongues required for the plug connections 2a, 2b are preferably integrally formed on the relevant profile longitudinal side.

Furthermore, the support profile 1 in FIG. 5 has two integrated heating or cooling ducts 3 on the inside of the module holding surface 2a, through which a liquid or gaseous heating or cooling medium can be passed in order, in particular, to cool or to heat the module holding surface 2a of the support profile 1 in the desired manner.

Figure 8:
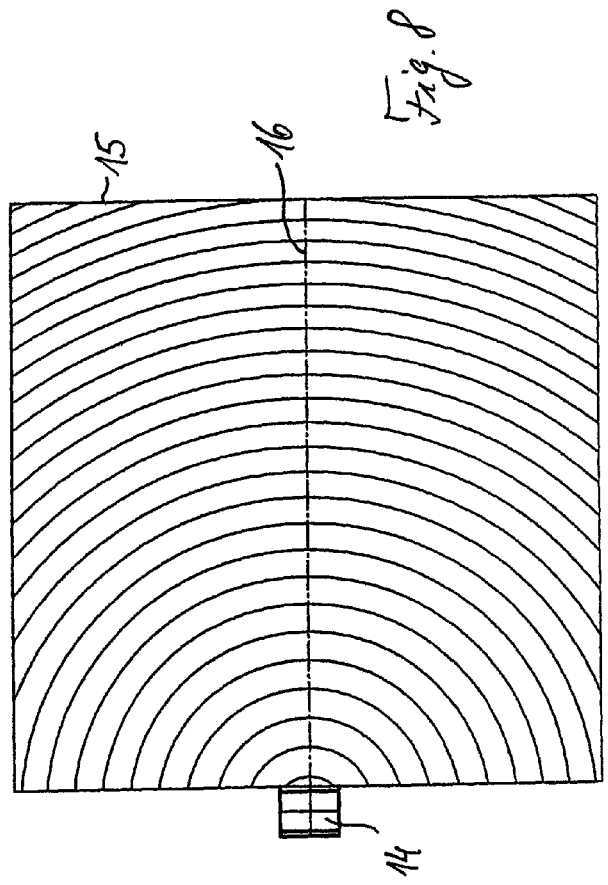
FIG. 8 is a plan view of one of the point-focus reflector elements shown in FIG. 7, with a corresponding solar module element.

FIGS. 6 to 8 illustrate a solar module system of the point-focus parabolic concentrator type, which, like the exemplary embodiments shown in FIGS. 1 to 5, is formed by arranging suitably designed, identical hollow-chamber longitudinal profiles 10 in one or more rows as support profiles. In an upper, rearward profile wall area, this support profile 10 also has a module holding surface 2a, on which a solar module element 14 is held using a holding tab 11 at the top and a clamping profile 12 at the bottom, with a clamping-holding strip 13 plugged on.

In contrast to the line concentrator types shown in FIGS. 1 to 5, the overall effective parabolic reflector area which is associated with one of the plurality of support profiles 10 that are located alongside one another is not formed by an area that is continuous in the support profile longitudinal direction, but rather by a plurality of individual parabolic reflector elements 15 which are provided alongside one another in the longitudinal direction on the support profile 10. FIG. 6 shows a single reflector element 15 such as this, in the form of a longitudinal section along a longitudinal plane 16 that is shown in FIG. 8, while FIG. 8 shows a single reflector element 15 in the form of a plan view, that is to say in a view along the arrow D in FIG. 6. For illustration purposes, FIG. 8 shows associated level lines. The individual cup-shaped reflector element 15 with an approximately square outline in the illustrated example results, because of its parabolic cup shape, in point-like or spot-like focusing or concentration of the incident solar radiation on the respectively associated solar module element 14 which, as in the case of the exemplary embodiments shown in FIGS. 1 to 5, is located on the rear face of the respective support profile 10 in front of it.

As FIG. 6 also shows, the individual reflector elements 15 are held by way of a plug-in/latching connection 17 on the support profile front face, which for this purpose is provided with matching plug-in/latching connection profiling. In contrast to the exemplary embodiments shown in FIGS. 1 to 5, the effective reflector area in the exemplary embodiment shown in FIGS. 6 to 8, that is to say the internal area of the reflector elements 15, is in consequence mounted on the front face of the support profile and is not formed directly by the front face of a support profile.

Analogously to FIG. 3, FIG. 7 shows a typical arrangement including a two-dimensional array, in the form of a matrix, of point-focus reflector elements 15 such as these in the form of a plan view, although the associated support profiles located underneath cannot be seen in the plan view in FIG. 7. These run in the row direction, that is to say for the reflector element array in FIG. 7 with the seven reflector element rows, seven support profiles 10 are correspondingly arranged one behind the other with the associated reflector elements 15 in the row direction being mounted alongside one another on the relevant support profile.

As FIG. 7 also shows, the individual point-focus reflector elements 15 are arranged alongside one another with virtually no gaps in the row and column directions. Although this cannot be seen per se, since they are mounted on the support profile rear face, the associated solar module elements 14 are shown at their corresponding positions in FIG. 7, in order to assist understanding.

As described above with reference to the exemplary embodiment shown in FIG. 3, just one central lateral support is sufficient for attachment of the structure shown in FIG. 7, depending on the requirement and specific application, supporting the individual support profiles 10 in their longitudinal center area, or else two lateral supports at the end and optionally drawn in somewhat.

Since, in the exemplary embodiment shown in FIGS. 6 to 8, the point-focusing behavior results in light also being concentrated in the support profile longitudinal direction, this results in a higher concentration level, with the design otherwise being analogous, than the line-focus type, so that the required solar module area can be reduced further in comparison to the line-focus type, if required, with the same effective reflective area. In other words, in the arrangement shown in FIGS. 6 to 8, just comparatively small-area individual solar module elements 14 are sufficient, and are mounted at a distance from one another on the respective support profile 10, in the support profile longitudinal direction. It is therefore not essential to provide a solar module strip that is continuous in the longitudinal direction in order to exploit all the reflected radiation.

In an alternative embodiment, instead of being fitted to the rear face of a support profile, the individual solar module elements 14 can also be fitted directly to the rear face of the individual reflector elements 15 mounted on the respective support profile. The support profile then has no profile wall in the corresponding area, or at most a transparent wall, in order that the light which is reflected by a reflector element mounted on the next support profile can pass without any impediment to the solar module element on the rear face of the reflector element located in front.

As is evident from the exemplary embodiments that have been illustrated and explained above, the invention provides a combined support and cooling profile, which can be produced comparatively easily, is self-supporting as a hollow longitudinal profile, and may contain a heating or cooling duct and/or an integrally formed heat dissipation structure, which is thermally conductively connected to a module holding surface and/or a reflector functional area, such that heat can effectively be dissipated from there. The reduction in the operating temperature that can be achieved in this way for solar modules that have been fitted allows an increased energy yield. This applies both to photovoltaic cells composed of crystalline silicon and to thin-film solar cells on a sheet, metal sheet or membrane mount. The support profiles can be produced very easily and at low cost, for example by extrusion, strand drawing or roll forming from thermally conductive material, such as aluminum, magnesium, stainless steel, galvanized steel or a thermally conductive plastic material. The support structure concept according to the invention allows a very high degree of prefabrication and preassembly for corresponding photovoltaic systems. It is self-evident that the invention can be used in the same way for thermal solar collector systems.

The support structure according to the invention is suitable for large-area integrated photovoltaic systems in large power stations, as well as for open air use and for building integration. Roof or facade elements including shadow laminate installations can be installed without any complex substructure with relatively little installation effort, for example as a building skin. This results in facade and roof systems such as these having a high degree of modularity which can be related primarily to the physical constraints, such as the facade grid system, storey height, etc.

Photovoltaic module units with a relatively low weight which are highly robust and in particular have longitudinal stiffness can be produced particularly advantageously by a combination of support profiles composed of aluminum, for example manufactured as strand-drawn elements, with photovoltaic sheet laminates.

In all the applications, the invention provides a support structure which can be produced easily with a combined support/cooling profile, which has comparatively high torsional and bending stiffness, and a long minimum support width. The support/cooling profile carries out the entire support function for the solar module and/or reflector elements that are fitted and are attached thereto, for example by suitable clamps, building techniques, and/or adhesive bonds. At the same time, the support profile acts as a heat sink.

At their ends, the support profiles are connected, for example via integrated screw ducts and/or groove ducts in the form of a drawn-in attachment, to suitable, conventional lateral supports, as required, to form relatively large support units.

The solar modules are preferably provided with transparent front sheets instead of front glass panes, which is advantageous with regard to the thermal expansion coefficient, weight, risk of fracture and format restriction, and are connected with good thermal contact to the support profile located underneath, for example by direct lamination or indirectly by adhesive bonding or clamping prelaminated units on, for example, photovoltaic laminates without glass.

For static integration into the building skin, the support profiles may be preassembled to form relatively large support units matched to the building grid system, and are then provided with a photovoltaic sheet composite as a solar module by lamination, adhesive bonding, etc. In the case of systems with readjustment, the support units are mounted on appropriate lateral supports such that they can rotate. In corresponding embodiments, a plurality of support units are combined via suitable coupling elements, such as tie rods and compression rods, to form relatively large system units, and are readjusted to follow the incident light, by means of a common drive. For example, ten or more rotating units may be connected in each case to a solar module area of about 7.5 $m^2$, to form a subsystem on a stand. Installations such as these on stands can be installed both outdoors as well as on flat roofs and inclined roofs.

In a further advantageous embodiment with a stand, the support profiles are assembled for solar readjustment to form large table units and are connected via drawn-in lateral supports to a central rotation apparatus with a vertical rotation axis. In this arrangement, which is particularly suitable for outdoor use, rotation units or subsystems with a solar module area of more than 100 $m^2$ can be produced. In a further optimized stand form, the inclination angle of the rotating tables can also be swiveled thus allowing two-axis readjustment accounting for the time of day.

It should be stressed once again that the implementation according to the invention of the support profiles as self-supporting hollow longitudinal profiles is adequate to support the support structures constructed in this way in the end face areas, and there is no absolute necessity for further lateral bracing between the end holder or mounting of the support structures constructed in this way. This is because the support profiles have adequate self-supporting longitudinal stiffness with a comparatively low natural weight, by virtue of their hollow profile structure.

The invention claimed is:

1. A solar module system of a parabolic concentrator type, comprising:
   a self-supporting support structure comprising a plurality of individual self-supporting hollow-chamber profiles, which are arranged alongside one another and are physically separated from one another,
   wherein each of the self-supporting hollow-chamber profiles comprises a parabolic concentrator reflector functional area on a front face, and a solar module functional area facing away from the front face, and
   wherein a hollow-chamber shape of each of the self-supporting hollow-chamber profiles extends substantially along an entire length of the parabolic concentrator reflector functional area in a longitudinal direction.

2. The solar module system as claimed in claim 1, wherein the self-supporting hollow-chamber profiles are in the form of extruded, strand-drawn or roll-formed profiles.

3. The solar module system as claimed in claim 2, wherein the self-supporting hollow-chamber profiles are formed from aluminum, magnesium, stainless steel, a galvanized steel material, or a thermally conductive plastic material.

4. The solar module system as claimed in claim 2, wherein each self-supporting hollow-chamber profile has a heat dissipation structure thermally conductively connected to at least one of its solar module functional area and its reflector functional area.

5. The solar module system as claimed in claim 1, wherein the self-supporting hollow-chamber profiles are formed from aluminum, magnesium, stainless steel, a galvanized steel material, or a thermally conductive plastic material.

6. The solar module system as claimed in claim 5, wherein each self-supporting hollow-chamber profile has a heat dissipation structure thermally conductively connected to at least one of its solar module functional area and its reflector functional area.

7. The solar module system as claimed in claim 6, wherein the self-supporting hollow-chamber profiles have one or more heating or cooling medium ducts and/or power supply ducts.

8. The solar module system as claimed in claim 1, wherein each self-supporting hollow-chamber profile has a heat dissipation structure thermally conductively connected to at least one of its solar module functional area and its reflector functional area.

9. The solar module system as claimed in claim 8, wherein the self-supporting hollow-chamber profiles have one or more heating or cooling medium ducts and/or power supply ducts.

10. The solar module system as claimed in claim 8, wherein each self-supporting hollow-chamber profile is formed from a plurality of profiled parts which are plugged together on a longitudinal side.

11. The solar module system as claimed in claim 8, wherein each self-supporting hollow-chamber profile has a line-focus parabolic reflector surface, which is continuous in the longitudinal direction, as the parabolic concentrator reflector functional area.

12. The solar module system as claimed in claim 8, wherein each self-supporting hollow-chamber profile has a plurality of separate point-focus parabolic reflector surfaces, which are arranged alongside one another in the longitudinal direction, as the parabolic concentrator reflector functional area.

13. The solar module system as claimed in claim 1, wherein the self-supporting hollow-chamber profiles have one or more heating or cooling medium ducts and/or power supply ducts.

14. The solar module system as claimed in claim 13, wherein each self-supporting hollow-chamber profile is formed from a plurality of profiled parts which are plugged together on a longitudinal side.

15. The solar module system as claimed in claim 1, wherein each self-supporting hollow-chamber profile is formed from a plurality of profiled parts which are plugged together on a longitudinal side.

16. The solar module system as claimed in claim 15, wherein each self-supporting hollow-chamber profile has a line-focus parabolic reflector surface, which is continuous in the longitudinal direction, as the parabolic concentrator reflector functional area.

17. The solar module system as claimed in claim 15, wherein each self-supporting hollow-chamber profile has a plurality of separate point-focus parabolic reflector surfaces, which are arranged alongside one another in the longitudinal direction, as the parabolic concentrator reflector functional area.

18. The solar module system as claimed in claim 1, wherein each self-supporting hollow-chamber profile has a line-focus parabolic reflector surface, which is continuous in the longitudinal direction, as the parabolic concentrator reflector functional area.

19. The solar module system as claimed in claim 1, wherein each self-supporting hollow-chamber profile has a plurality of separate point-focus parabolic reflector surfaces, which are arranged alongside one another in the longitudinal direction, as the parabolic concentrator reflector functional area.

20. The solar module system as claimed in claim 1, wherein a length of each self-supporting hollow-chamber profile in the longitudinal direction is between approximately 2 m and approximately 10 m.

21. The solar module system as claimed in claim 1, wherein the self-supporting support structure is held by only one approximately centrally arranged lateral support that extends approximately orthogonal to the longitudinal direction of the self-supporting hollow-chamber profiles.

22. The solar module system as claimed in claim 1, wherein the self-supporting support structure is held by only two end lateral supports, each of which extends approximately orthogonal to the longitudinal direction of the self-supporting hollow-chamber profiles.

23. The solar module system as claimed in claim 22, wherein the two end lateral supports are separated by no more than a few tens of centimeters.

24. The solar module system as claimed in claim 22, wherein the two end lateral supports are arranged near respective end faces of the self-supporting hollow-chamber profiles.

25. The solar module system as claimed in claim 1, wherein a space is provided between each of the adjacent and physically separated self-supporting hollow-chamber profiles.

26. The solar module system as claimed in claim 1, wherein the self-supporting hollow-chamber profiles are not supported by a sub-structure longitudinal support that extends along the longitudinal direction of the self-supporting hollow-chamber profiles.

* * * * *